(12) United States Patent
Wakana et al.

(10) Patent No.: US 9,497,866 B2
(45) Date of Patent: Nov. 15, 2016

(54) ELECTRONIC CONTROL DEVICE

(71) Applicant: Hitachi Automotive Systems, Ltd., Hitachinaka-shi, Ibaraki (JP)

(72) Inventors: Yoshinori Wakana, Hitachinaka (JP); Masaru Kamoshida, Hitachinaka (JP); Yasuro Kameshiro, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/777,601

(22) PCT Filed: Jan. 31, 2014

(86) PCT No.: PCT/JP2014/052192
§ 371 (c)(1),
(2) Date: Sep. 16, 2015

(87) PCT Pub. No.: WO2014/148120
PCT Pub. Date: Sep. 25, 2014

(65) Prior Publication Data
US 2016/0143158 A1    May 19, 2016

(30) Foreign Application Priority Data

Mar. 19, 2013  (JP) ................................ 2013-055947

(51) Int. Cl.
*H05K 5/00* (2006.01)
*H05K 7/14* (2006.01)
*H05K 5/02* (2006.01)

(52) U.S. Cl.
CPC .......... *H05K 5/0013* (2013.01); *H05K 5/0039* (2013.01); *H05K 5/0221* (2013.01); *H05K 7/1418* (2013.01)

(58) Field of Classification Search
USPC ......................................... 361/752, 748, 736
See application file for complete search history.

(56) References Cited

U.S. PATENT DOCUMENTS 7,144,258 B2    12/2006  Ariga et al.
7,417,868 B2    8/2008   Morisada
(Continued)

FOREIGN PATENT DOCUMENTS

JP    54-180942 U    12/1979
JP    58-95693 U     6/1983
(Continued)

OTHER PUBLICATIONS

International Search Report (PCT/ISA/210) dated Mar. 18, 2014 with English-language translation (four (4) pages).

*Primary Examiner* — Andargie M Aychillhum
(74) *Attorney, Agent, or Firm* — Crowell & Moring LLP

(57) ABSTRACT

Provided is an electronic control device which has a circuit board fixing structure with a simple configuration and suppresses a phenomenon of falling off of the circuit board from a case body by mechanical external force. An elastically deformable engaging part and an engaged part for complementarily engaging with this engagement part are provided on a circuit board or a case body. When the circuit board is slid and housed in a guide rail part formed inside the case body, the engaging part is deformed. When the circuit board reaches a predetermined position, the engaging part is engaged with the engaged part formed at the circuit board or the case body. With this configuration, the case body and the circuit board can be reliably fixed with a simple configuration.

15 Claims, 17 Drawing Sheets

(56) References Cited

U.S. PATENT DOCUMENTS

2010/0055960 A1\* 3/2010 Hsu .................. H01R 12/88
 439/342
2011/0299258 A1\* 12/2011 Ishii .................. B41J 29/02
 361/752

FOREIGN PATENT DOCUMENTS

| JP | 63-119292 U | 8/1988 |
|----|-------------|--------|
| JP | 5-13095 U | 2/1993 |
| JP | 5-95085 U | 12/1993 |
| JP | 2001-111264 A | 4/2001 |
| JP | 2005-101088 A | 4/2005 |
| JP | 2006-19674 A | 1/2006 |
| JP | 2007-134539 A | 5/2007 |

\* cited by examiner

ELECTRONIC CONTROL DEVICE

TECHNICAL FIELD

The present invention relates to an electronic control device which houses a circuit board mounted with an electronic component, and particularly relates to an electronic control device configured to house a circuit board by sliding it along a pair of guide grooves.

BACKGROUND ART

An electronic control device which houses a circuit board mounted with an electronic component has been used in a variety of industrial technical fields. Particularly, a technique for fixing the circuit board is important in an industrial technical field to which mechanical external force, such as vibration, or thermal stress is applied.

For example, an intake system configuration member of an internal combustion engine mounted on an automobile is configured by combining many submodules, such as an air cleaner, an intake duct, an air flow sensor, a throttle body, and an intake manifold. Moreover, in recent years, in addition to sensors and actuators mounted on the respective submodules, there have been increasing number of examples in which an electronic control device which used to be disposed in a cabin hitherto is mounted within a hood of the automobile. Moreover, this electronic control device is configured to be fixed to another component within the hood of the automobile by a screw or the like.

Incidentally, the component within the hood is in an extremely severe installation environment by receiving vibration from the internal combustion engine or vibration based on running of the automobile. Accordingly, a circuit board disposed within the electronic control device is affected by this vibration and strongly receives mechanical external force. Further, a material, such as a resin, is used for this type of electronic control device to reduce a unit cost of production, and the electronic control device adopts a structure in which the circuit board is fixed therein without using an extra fixing means, such as a screw.

As such an electronic control device, for example, JP 2006-19674 A (PTL 1) discloses a case structure of an electronic control device including a circuit board mounted with an electronic component, a case body (a case) which is formed in a box shape with one open surface and has a guide groove part for inserting the circuit board on each internal side surface, and a lid (a cover) for covering the open surface of the case body. The circuit board is held in an internal space formed with the case body and the lid.

CITATION LIST

Patent Literature

PTL 1: JP 2006-19674 A

SUMMARY OF INVENTION

Technical Problem

According to PTL 1, the circuit board in a plane direction is positioned by a guide protrusion part. The guide protrusion part is provided at the guide groove part on each side surface of the case body, and a facing distance between the guide protrusion parts is set substantially equal to a width of the circuit board. The circuit board in a vertical direction is positioned by a vertical positioning part provided at the lid and having a width which is substantially equal to a thickness of the circuit board. Moreover, the guide protrusion part and the vertical positioning part guide the circuit board to a predetermined position and hold it at that position.

The guide groove part of the case body and the lid are configured to position the circuit board in a horizontal direction and a vertical direction. However, a mechanism for preventing the circuit board from falling off in the horizontal direction is not positively provided between the case body and the lid. Consequently, once the lid is detached from the case body, the circuit board may fall off from the guide groove part. Accordingly, when the circuit board falls off, the electronic control device loses its function anymore and cannot normally operate the internal combustion engine. A method for strongly fixing the case body and the lid by a fixing means, such as a screw, in between is also considered to prevent this falling off. However, since it is necessary to form a part for screwing the screw or perform an assembling process, such as screw tightening, a simpler fixing method is requested.

An object of the present invention is to provide an electronic control device which has a circuit board fixing structure with a simple configuration and suppresses a phenomenon of falling off of the circuit board from a case body by mechanical external force.

Solution to Problem

An aspect of the present invention is characterized as follows. An elastically deformable engaging part and an engaged part for complementarily engaging with this engagement part are provided on a circuit board or a case body. When the circuit board is slid and housed in a guide groove part formed inside the case body, the engaging part is deformed. When the circuit board reaches a predetermined position, the engaging part is engaged with the engaged part formed at the circuit board or the case body.

Advantageous Effects of Invention

According to the present invention, when a circuit board is slid in a guide groove part inside a case body, an engaging part is elastically deformed and the circuit board can be housed inside the case body. When the circuit board reaches a predetermined position, the engaging part can be engaged with an engaged part of the circuit board or the case body. Accordingly, the case body and the circuit board can be reliably fixed with a simple configuration. This configuration can solve a problem in that the circuit board is fallen off, an electronic control device loses its function, and an internal combustion engine cannot be operated normally.

DESCRIPTION OF EMBODIMENTS

Figure 1:
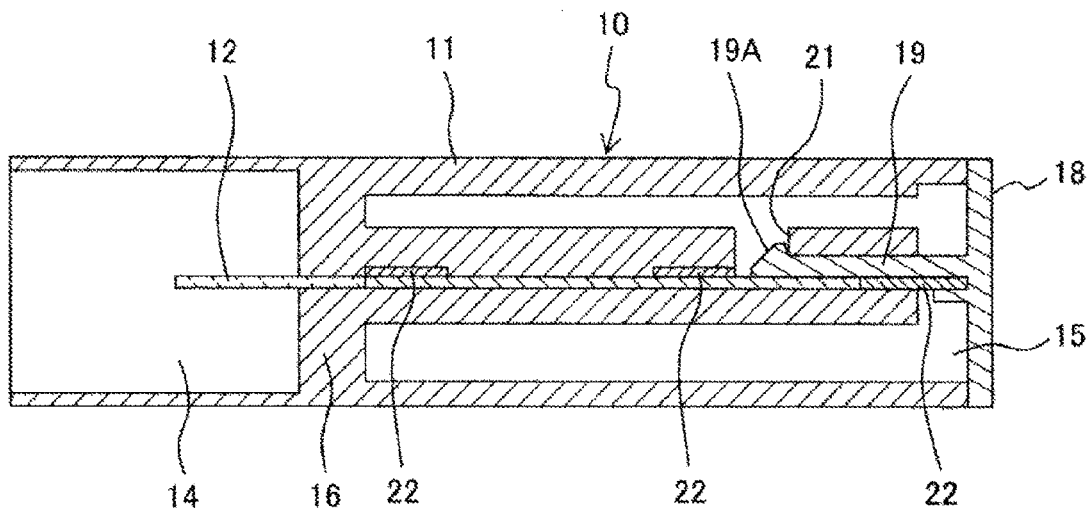
FIG. 1 is a longitudinal sectional view in a longitudinal direction of an electronic control device according to a first embodiment of the present invention.

Embodiments of the present invention will be described in detail by using the drawings. However, the present invention is not limited to the following embodiments and also includes various variations and applications in the scope of a technical concept of the present invention. Hereinafter, each of the embodiments will be described in detail by referring to the drawings.

Example 1

Figure 2:
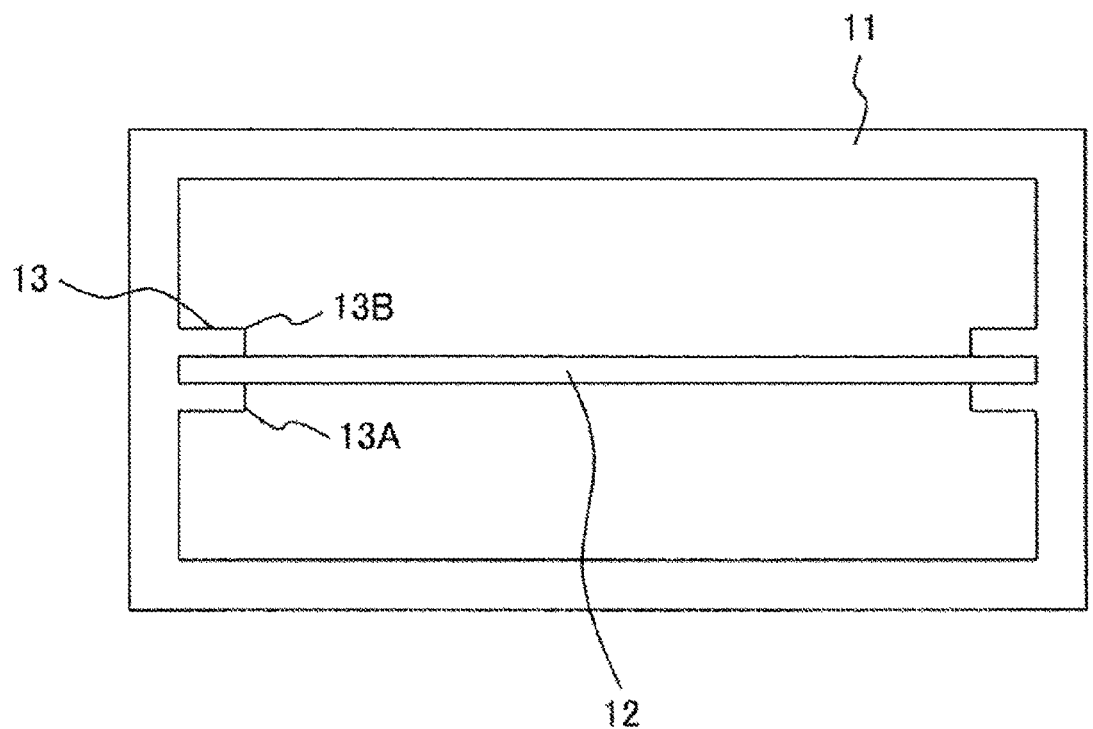
FIG. 2 is a sectional view in which a vicinity of a center part of the electronic control device illustrated in FIG. 1 is taken along in a vertical direction.
Figure 3:
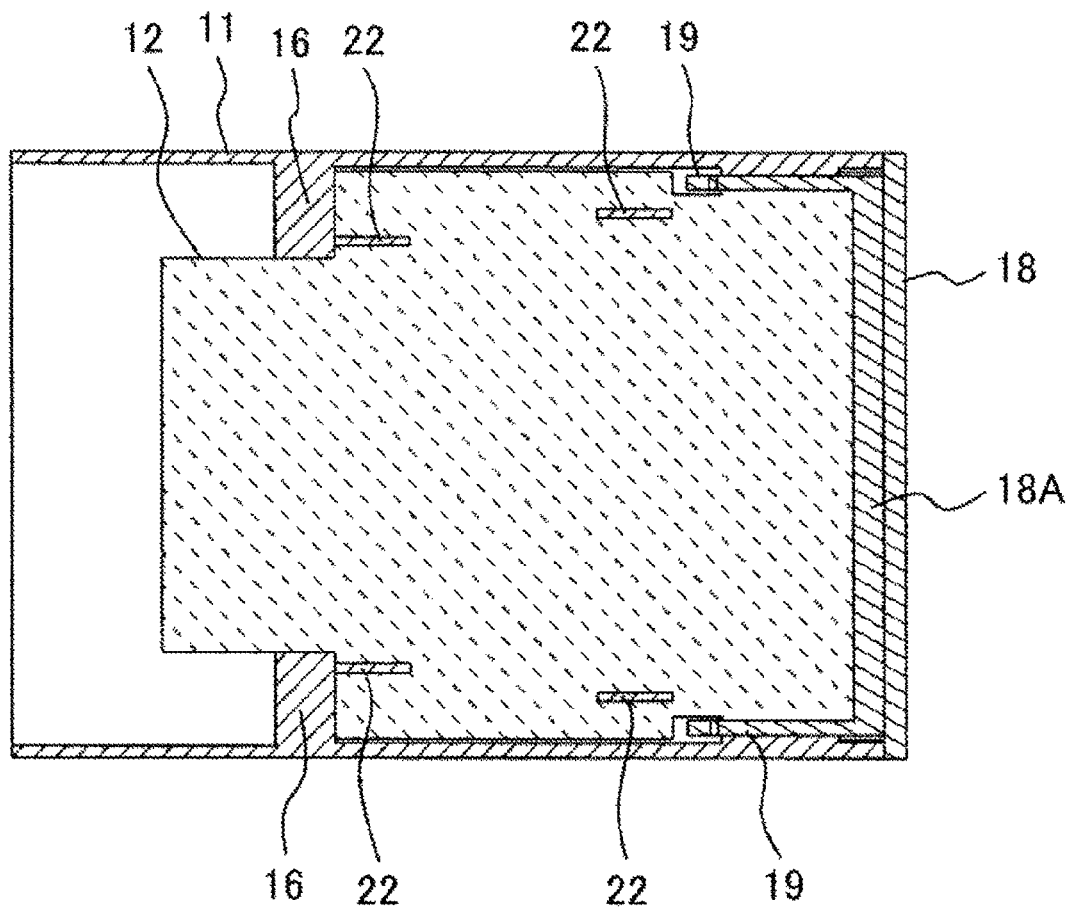
FIG. 3 is a cross sectional view in the longitudinal direction of the electronic control device illustrated in FIG. 1.

A first embodiment of the present invention will be described by using FIGS. 1 to 3. Here, FIG. 1 illustrates a section in a longitudinal direction of a vicinity of a guide groove described below. As illustrated in FIGS. 1 to 3, in an electronic control device 10, a circuit board 12 mounted with an electronic component is housed inside a case body 11 formed of a synthetic resin, such as polybutylene terephthalate. Both side surface parts in a longitudinal direction of the circuit board 12 are slidably fitted to two guide grooves 13 formed inside the case body 11 and extending in the longitudinal direction. The guide groove 13 is configured by a pair of upper and lower guide rails 13A, 13B protruding inward inside the case body 11. It should be noted that the "fit" herein is not a fixed state, such as press fit. Each side surface part of the circuit board 12 is inserted into the guide groove 13 within a tolerance range and almost without a gap, and the circuit board 12 can slide inside the guide groove 13 in the longitudinal direction.

A connector mounting part 14 is formed at one end in the longitudinal direction of the case body 11, and a lid cover mounting part 15 serving as an opening is formed at another end on an opposite side thereof. Therefore, a connector (not illustrated) is watertightly mounted to the connector mounting part 14. Further, the circuit board 12 is inserted from the lid cover mounting part 15 on a left side in the drawing, and each side surface part of the circuit board 12 is slid, guided, and fixed at a predetermined position by the guide groove 13. A board reception part 16 for preventing movement of the circuit board 12 to the connector mounting part 14 side is formed in a vicinity of the connector mounting part 14 of the case body 11. This board reception part 16 is configured to prevent the movement of the circuit board 12 by butting against a step part 17 formed at each side end part of the circuit board 12. This position becomes a final fixed position of the movement of the circuit board 12 to the connector mounting part 14 side.

The lid cover mounting part 15 is a rectangular opening elongated in a horizontal direction. A lid cover 18 has a shape matching with that of this opening and is also formed of a synthetic resin, such as polybutylene terephthalate. The lid cover 18 is fixed to the lid cover mounting part 15 by ultrasonic welding or the like. This lid cover 18 employs a configuration that is integrally fixed with the circuit board 12 in advance.

Figure 4:
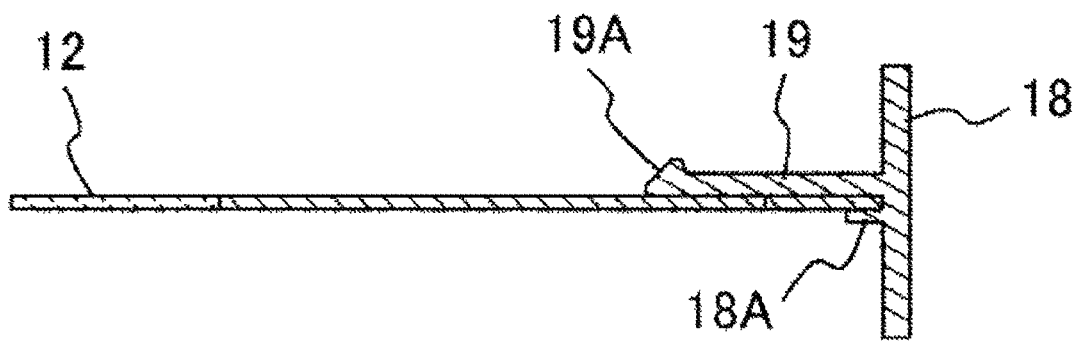
FIG. 4 is a longitudinal sectional view in the longitudinal direction when a circuit board and a lid cover illustrated in FIG. 1 are combined.
Figure 5:
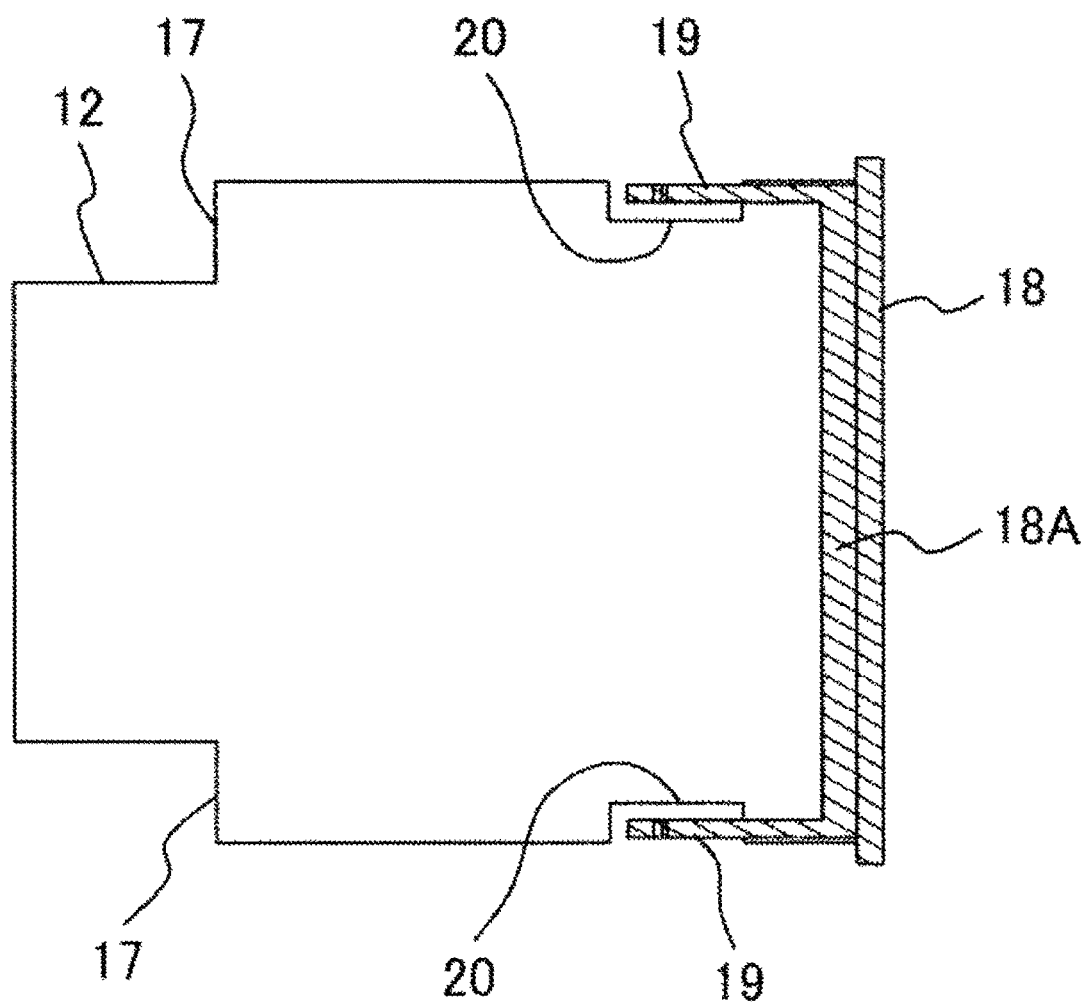
FIG. 5 is a top view when the circuit board and the lid cover illustrated in FIG. 4 are combined.

In other words, as illustrated in FIGS. 4 and 5, an end surface of the circuit board 12 is fixed to a fixed surface 18A formed inside the lid cover 18 by using a fixing means, such as an adhesive. An inside of the case body 11 is sealed by the lid cover 18 simultaneously with the insertion of the circuit board 12. In this case, the lid cover mounting part 15 and the lid cover 18 are fitted with each other after the circuit board 12 is housed and installed in the guide groove 13. Accordingly, the lid cover mounting part 15 and the lid cover 18 are fixed in this state by the ultrasonic welding or the like.

Therefore, the circuit board 12 and the case body 11 must be strongly fixed at this time. In the present example, the circuit board 12 and the case body 11 are fixed inside the case body 11 by employing the following configuration.

As illustrated in FIGS. 4 and 5, an engaging part 19 displaced in a direction vertical to a paper surface in FIG. 5 is integrally formed with each end of the rectangular lid cover 18. Since a pawl part 19A is formed on a tip side of the engaging part 19 and further the lid cover 18 is formed of a synthetic resin, the engaging part 19 integrally formed with this lid cover 18 is elastically displaceable. Therefore, the engaging part 19 is displaced so as to cross a plane of the circuit board 12 vertically. Accordingly, a cutaway part 20 is formed at a part of the circuit board 12 in which the engaging part 19 is displaced, and the engaging part 19 can be displaced freely.

Moreover, a locking part 21 configuring an engaged part and complementarily engaging with the pawl part 19A of the engaging part 19 is formed at a portion of the guide rail 13B forming the guide groove part 13 and formed inside the case body 11. A position of this locking part 21 is a position at which the step part 17 formed at each side end part of the circuit board 12 is butted against the board reception part 16. The pawl part 19A of the engaging part 19 is positioned so as to engage with the locking part 21. Therefore, since the pawl part 19A of the engaging part 19 engages with the locking part 21 formed at the guide rail 13B, the circuit board 12 cannot be moved to the lid cover mounting part 15 side, and this position becomes a final fixed position of the movement of the circuit board 12 toward the lid cover mounting part 15 side.

Figure 6:
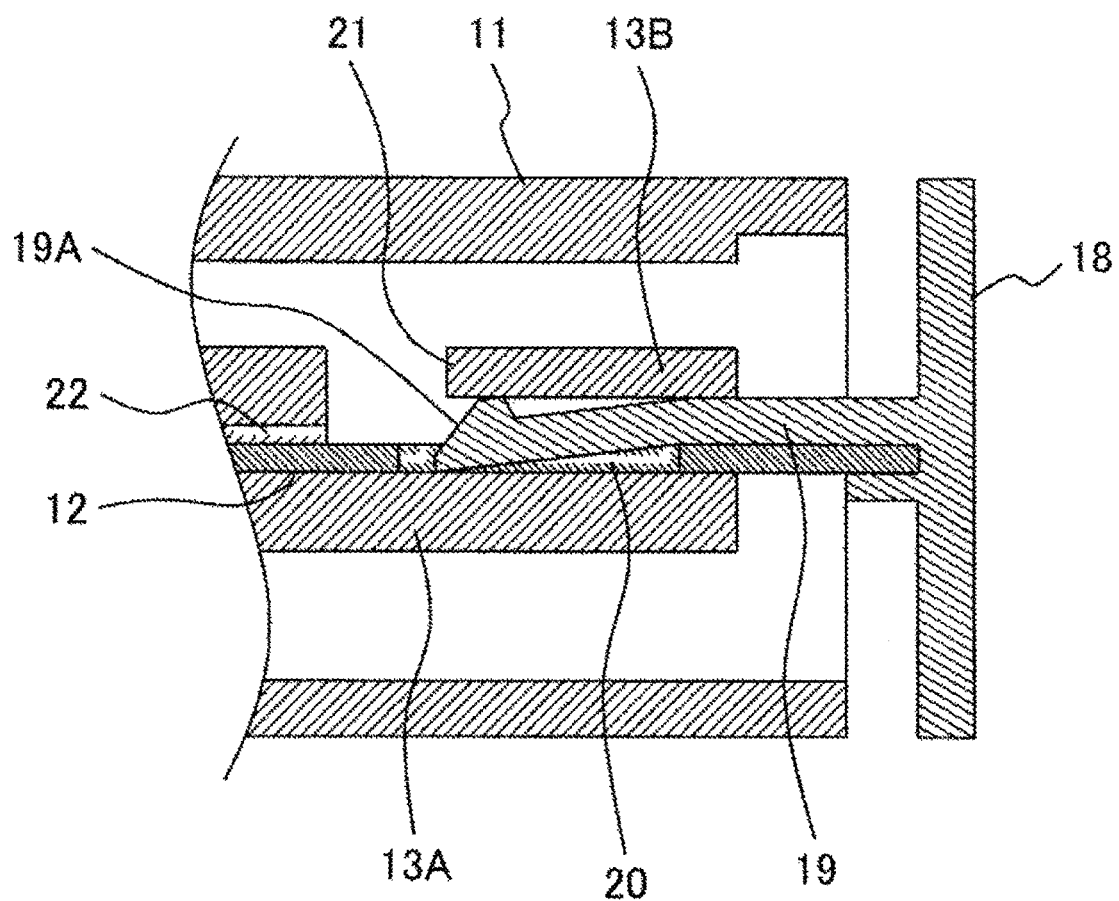
FIG. 6 is a longitudinal sectional view illustrating a state in which the lid cover and the circuit board are in the middle of being housed in a case body illustrated in FIG. 1.

FIG. 6 illustrates a state in which the circuit board 12 integrated with the lid cover 18 is in the middle of being housed in the case body 11. Each side surface part of the circuit board 12 fixed to the lid cover 18 is inserted, slid, and guided into the guide groove 13 formed by the guide rails 13A and 13B inside the case body 11. At this time, the pawl part 19A provided at the tip of the engaging part 19 is deflected downward by the guide rail 13B and is displaced to the cutaway part 20 of the circuit board 12 by this deflection. Accordingly, the circuit board 12 is guided into the guide groove 13 and advances toward a deep side of the inside of the case body 11, i.e., the connector mounting part 14 side.

Figure 7:
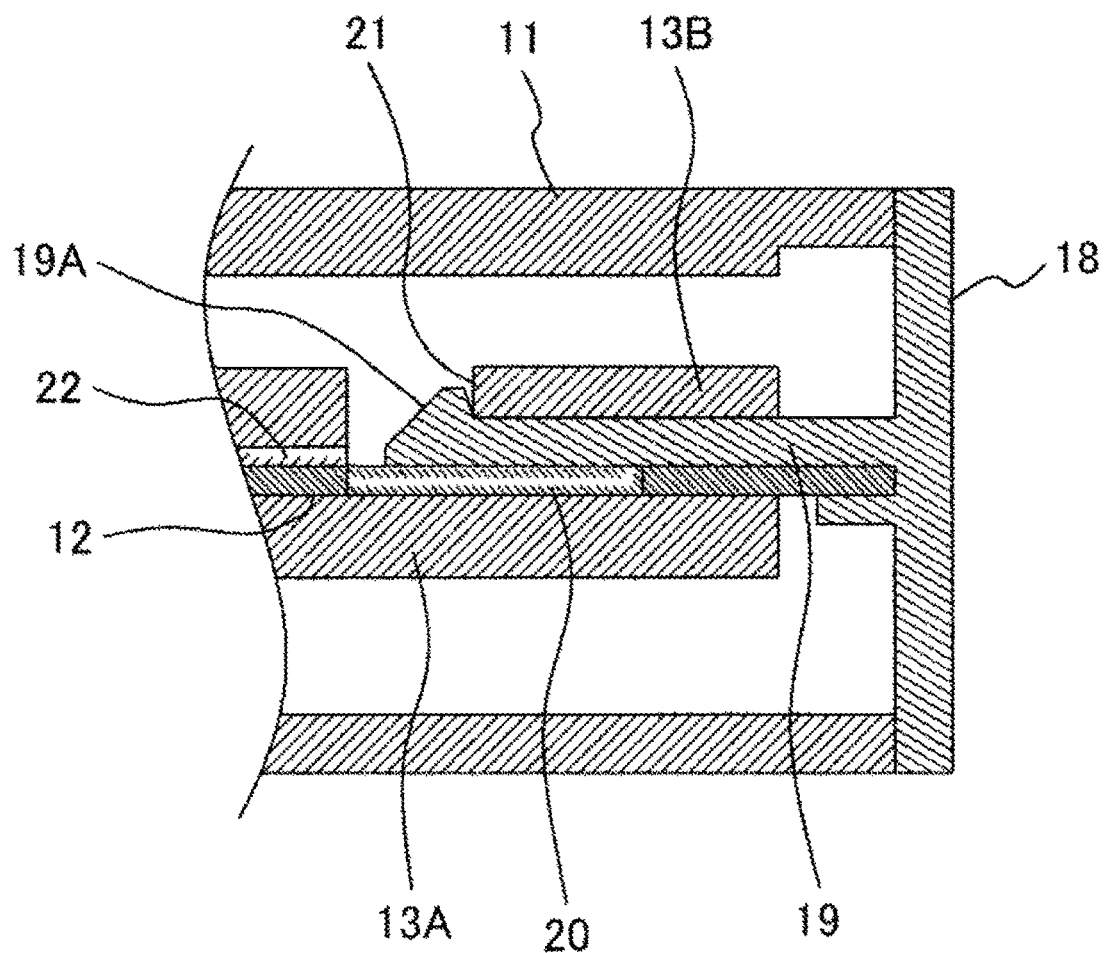
FIG. 7 is a longitudinal sectional view illustrating a final state in which the lid cover and the circuit board are housed in the case body illustrated in FIG. 1.

Further, FIG. 7 illustrates a state in which the circuit board 12 integrated with the lid cover 18 has reached a predetermined position in the case body 11. Each side surface part of the circuit board 12 fixed to the lid cover 18 is inserted, slid, and guided into the guide groove 13 formed by the guide rails 13A and 13B inside the case body 11. After passing through a process illustrated in FIG. 6, the step part 17 formed at each side end part of the circuit board 12 and the board reception part 16 are butted against each other. Then, the engaging part 19 of the lid cover 18 is released from restriction by the guide rail 13B at this position and returned to an original position by elasticity. The engaging part 19 is engaged with the locking part 21 formed at the guide rail 13B.

In this way, when the step part 17 formed at each side end part of the circuit board 12 and the board reception part 16 are butted against each other, the movement of the circuit board 12 to the connector mounting part 14 side is prevented. Further, when the engaging part 19 of the lid cover 18 is engaged with the locking part 21 formed at the guide rail 13B, the movement of the circuit board 12 to the lid cover mounting part 15 side is prevented. Accordingly, a phenomenon of falling off of the circuit board 12 from the case body 11 can be solved. Moreover, the lid cover 18 and the lid cover mounting part 15 are welded to be sealed in this state by the ultrasonic welding or the like.

In this way, when the circuit board 12 and the lid cover 18 are mounted to the case body 11, the circuit board 12 can be fixed inside the case body 11. Accordingly, the case body 11 and the circuit board 12 can be reliably fixed with a simple configuration. This configuration can solve a problem in that the circuit board 12 is fallen off, an electronic control device loses its function, and an internal combustion engine cannot be operated normally.

Further, as illustrated in FIG. 3, four protrusions 22 protruding downward and extending in the longitudinal direction by a predetermined distance are formed on the guide rail 13B of the case body 11. When the circuit board 12 is slid and guided in the guide groove 13, this protrusion 22 is crushed by a surface part of the circuit board 12 and has the same function and effect as those in a state of being press fitted. With this configuration, the movement of the circuit board 12 in a direction orthogonal to the plane of the circuit board 12 (hereinafter, referred to as a vertical direction) can be regulated or prevented. Further, since the engaging part 19 and the guide rail 13B are elastically in contact with each other, it contributes to prevention of the movement of the circuit board 12 in the vertical direction.

In this way, the movement of the circuit board 12 in the longitudinal direction is suppressed by the board reception part 16, the engaging part 19 of the lid cover 18, and the locking part 21 of the guide rail 13B. Further, the movement of the circuit board 12 in the vertical direction orthogonal to the longitudinal direction is suppressed by the protrusion 22 and the engaging part 19. Accordingly, the highly reliable electronic control device can be obtained.

It should be noted that in the present example, the engaging part 19 is configured to engage with the locking part 21 of the guide rail 13B. However, the locking part can be provided at the guide rail 13A. In this case, the engaging part 19 may be configured so that the pawl part 19A engages with the locking part of the guide rail 13A.

Further, a molding method is adopted in which molds for forming the case body 11 are butted against each other from both the connector mounting part 14 side and the lid cover mounting part 15 side and the synthetic resin is injected in this state. Accordingly, it is possible to realize a structure in which the pawl part 19A of the engaging part 19 is provided at the lid cover 18. Further, the side of the guide rail 13B at which the locking part 21 is formed and the opposite side thereof are cut away so that the molds are removable.

Example 2

Figure 8:
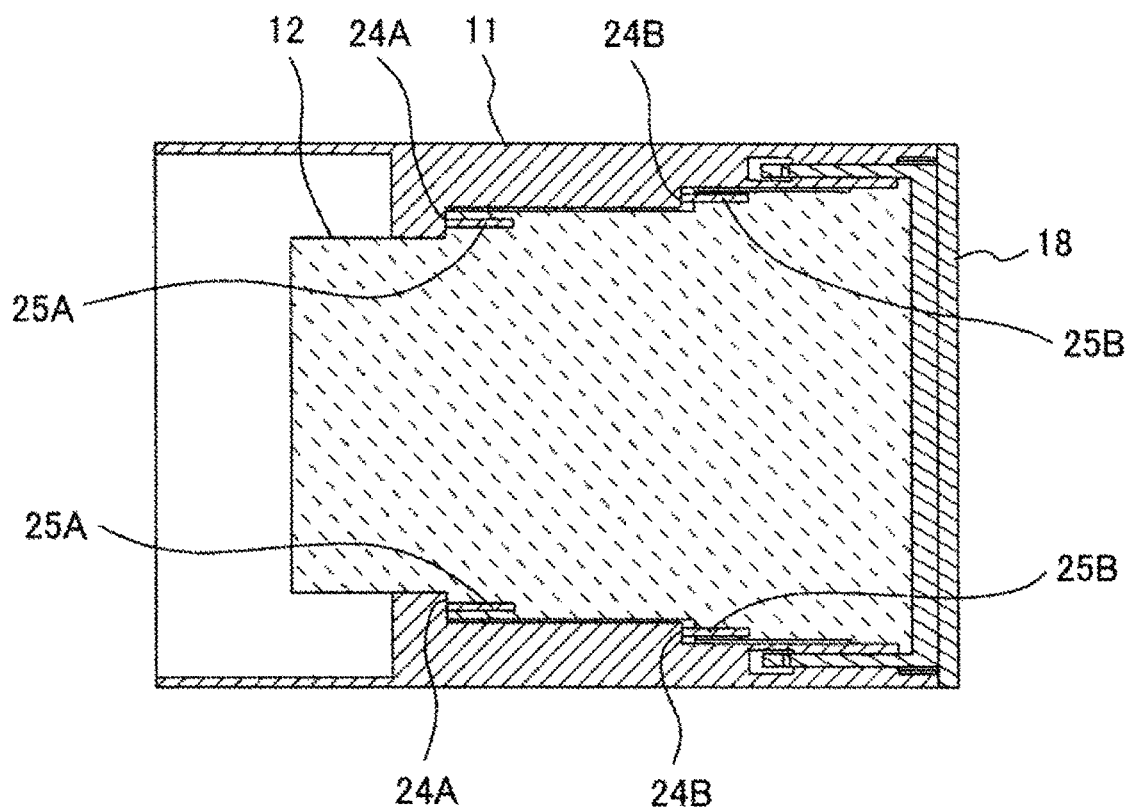
FIG. 8 is a cross sectional view in a longitudinal direction of an electronic control device according to a second embodiment of the present invention.
Figure 9:
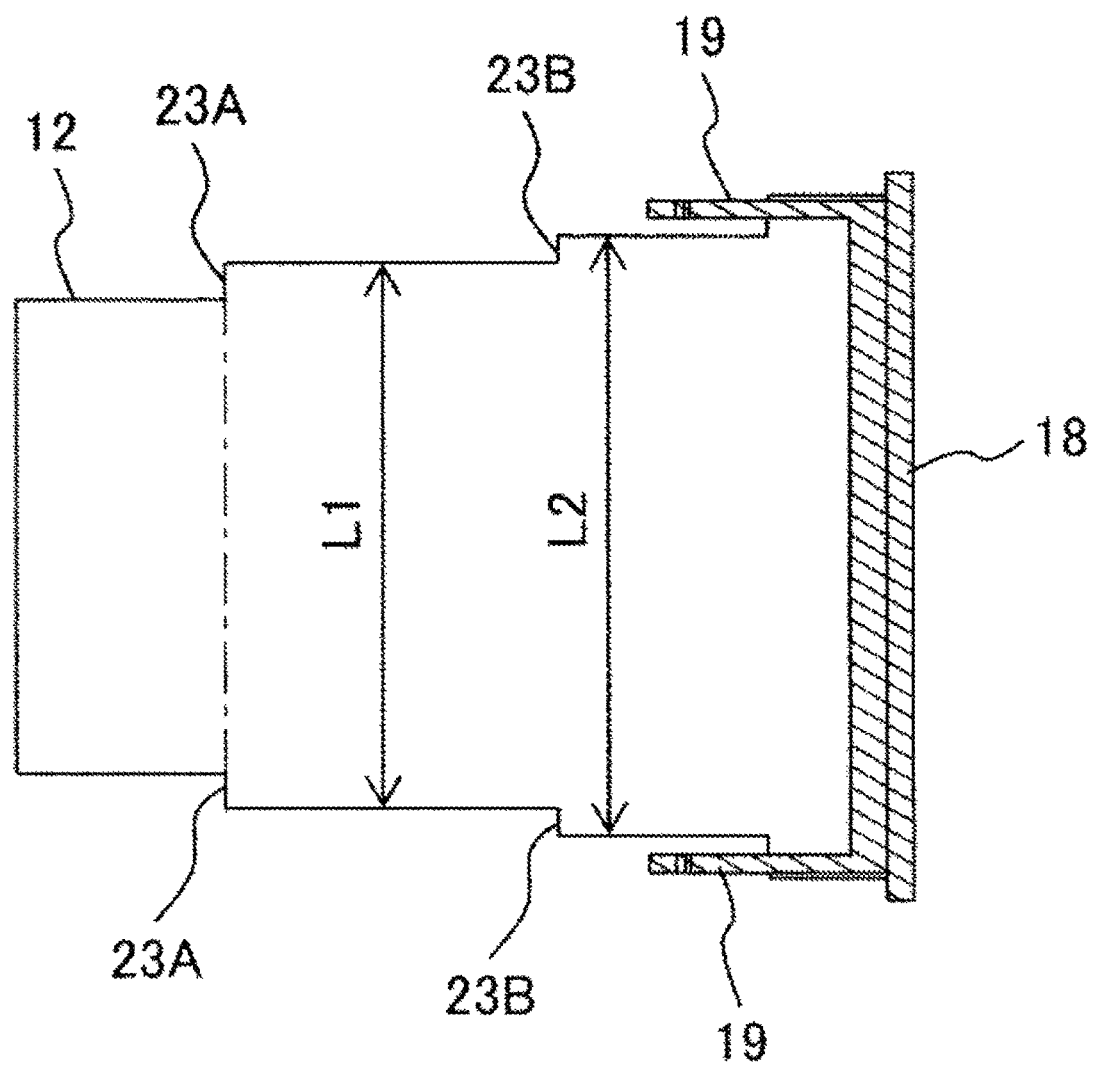
FIG. 9 is a top view in the longitudinal direction when a circuit board and a lid cover illustrated in FIG. 8 are combined.

Next, a second embodiment of the present invention will be described by using FIGS. 8 and 9. FIG. 8 is a cross sectional view in a longitudinal direction of an electronic control device. FIG. 9 is a top view in the longitudinal direction when a circuit board and a lid cover are combined.

In FIGS. 8 and 9, step parts 23A and 23B are formed on each side surface of a circuit board 12 from a tip side opposite to a lid cover 18. As illustrated in FIG. 9, a distance L1 of the step part 23A between both side surfaces is set small as compared with a distance L2 of the step part 23B between both side surfaces. In other words, the step part 23B is enlarged from a middle of the step part 23A in a direction toward the lid cover 18, and the step parts 23A and 23B are configured so as not to overlap each other in the longitudinal direction.

Further, board reception parts 24A and 24B respectively butted against the step parts 23A and 23B are formed inside a case body 11. Here, the board reception part 24B and the step part 23B are not brought into contact with each other while securing a predetermined gap, and the board reception part 24A and the step part 23A are brought into contact with and butted against each other. Consequently, movement of the circuit board 12 to a connector mounting part 14 side is regulated. The reason is that when both step parts 23A, 23B are butted against and brought into contact with the board reception parts 24A, 24B, dimensional control thereof is difficult. Accordingly, the step part 23A is butted against and brought into contact with the board reception part 24A on one side. Therefore, the board reception part 24B and the step part 23B may be configured to be brought into contact with and butted against each other.

Further, it is configured that the protrusions 22 formed on the guide rail 13B of the case body 11 illustrated in FIG. 3 and for regulating movement of the circuit board 12 in the vertical direction are provided to match forming positions of the step parts 23A and 23B. In other words, a protrusion 25A corresponding to the step part 23A and a protrusion 25B corresponding to the step part 23B are provided. These protrusions 25A and 25B are crushed by the respective step parts 23A and 23B of the circuit board 12 in a process in which the circuit board 12 is slid and guided in a guide groove 13.

In other words, if the protrusion 25B is provided at a position crushed by the step part 23A, the protrusion 25B is crushed from the beginning by the circuit board 12 over a long distance. Accordingly, a material of the protrusion 25B is scraped off and a press fitting effect may be decreased.

On the other hand, in the present example, when the circuit board 12 is inserted into the guide groove 13, the protrusion 25A is crushed first by the step part 23A, and the protrusion 25B is not crushed by this step part 23A. When the circuit board 12 is further inserted into the guide groove 13, the protrusion 25B is crushed by the step part 23B. With this configuration, since the protrusions 25A, 25B are crushed only once at a short distance, a closely attached state between the protrusions 25A, 25B and the step parts 23A, 23B is maintained by the press fitting effect, and the movement of the circuit board 12 in the vertical direction can be effectively regulated.

Further, when the distances for crushing the protrusions 25A, 25B are shortened, a press fit load on the circuit board 12 can be made small. Accordingly, an effect of reducing deformation of the circuit board 12 can be also expected.

Example 3

Next, a third embodiment of the present invention will be described by using FIG. 10. In this example, it is configured that a circuit board 12 is directly locked to an engaging part 26 provided at a case body 11.

Figure 10:
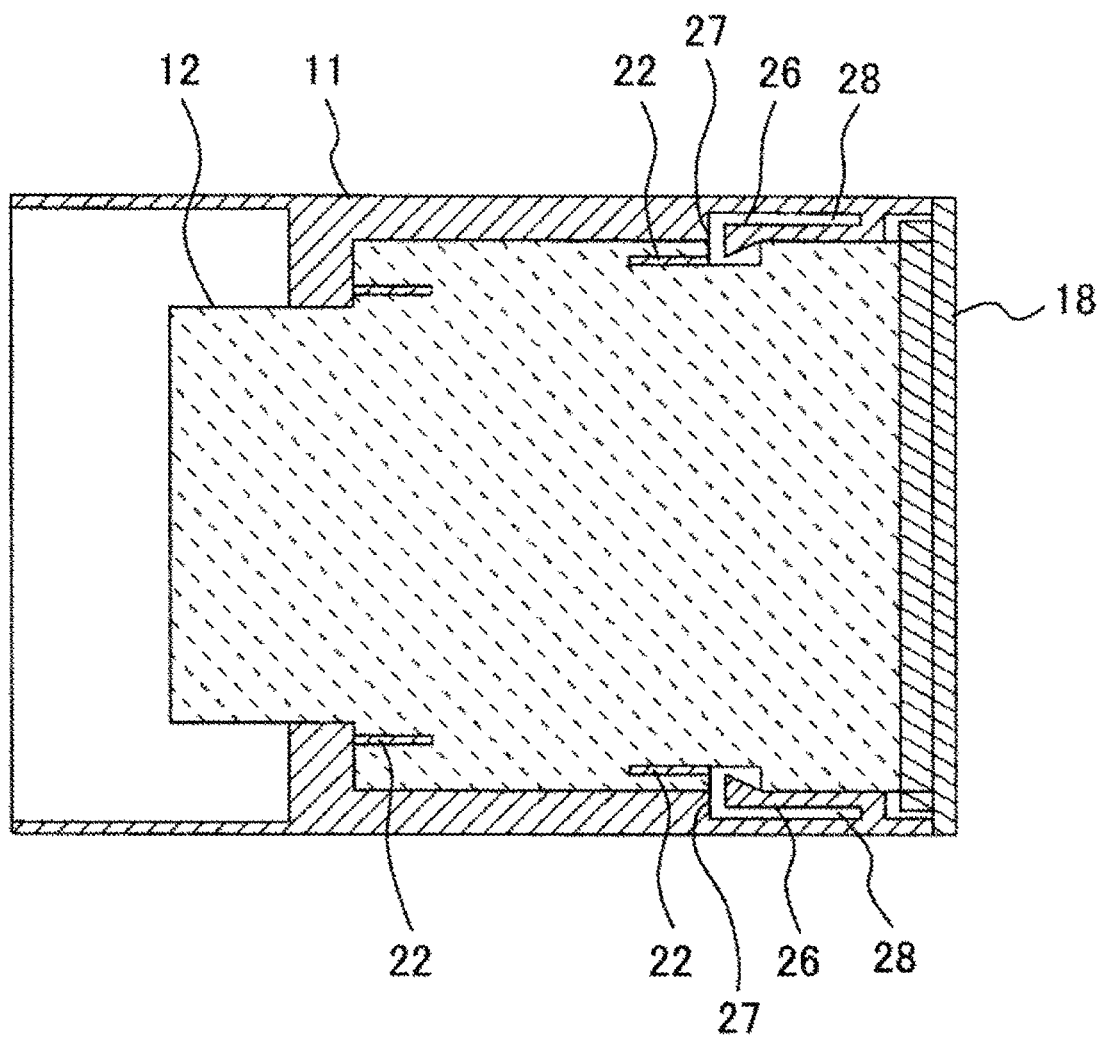
FIG. 10 is a cross sectional view in a longitudinal direction of an electronic control device according to a third embodiment of the present invention.

In FIG. 10, the circuit board 12 and a lid cover 18 are integrally configured as with Example 1. Moreover, it is configured that a locking part 27 formed by cutting away is provided on each side surface part of the circuit board 12 and the engaging part 26 is engaged with this locking part 27. The engaging part 26 is located on a lid cover mounting part 15 side than guide rails 13A, 13B (not illustrated) and is integrally formed with the case body 11. Needless to say, it is configured that elasticity is applied to the engaging part 26 as with Example 1.

This engaging part 26 has a function similar to that of the engaging part 19 described in Example 1. Specifically, the engaging part 26 is formed inside the case body 11 and at a position facing each side surface of the circuit board 12. Moreover, the engaging part 26 is elastically supported so as to be deformable in a plane direction of the circuit board 12. Because of this, a gap 28 is provided between the engaging part 26 and the case body 11. When the circuit board 12 is slid and guided in a guide groove, the engaging part 26 can be deformed by the gap 28. Accordingly, the engaging part 26 does not become an obstacle at the time of housing the circuit board 12.

In this way, when a step part 17 formed at each side end part of the circuit board 12 and a board reception part 16 are butted against each other, movement of the circuit board 12 to a connector mounting part 14 side is prevented. Further, when the engaging part 26 of the case body 11 is engaged with the locking part 27 formed at each side surface part of the circuit board 12, movement of the circuit board 12 to a lid cover mounting part 15 side is prevented. Accordingly, a phenomenon of falling off of the circuit board 12 from the case body 11 can be solved. Moreover, the lid cover 18 and the lid cover mounting part 15 are welded to be sealed in this state by ultrasonic welding or the like.

In this way, when the circuit board 12 and the lid cover 18 are mounted to the case body 11, the circuit board 12 can be fixed inside the case body 11. Accordingly, the case body 11 and the circuit board 12 can be reliably fixed with a simple configuration. This configuration can solve a problem in that the circuit board 12 is fallen off, an electronic control device loses its function, and an internal combustion engine cannot be operated normally.

Example 4

Next, a fourth embodiment of the present invention will be described by using FIG. 11. This example describes a configuration in which a circuit board 12 is directly locked to an engaging part 28 provided at a case body 11 on a connector mounting part 14 side.

Figure 11:
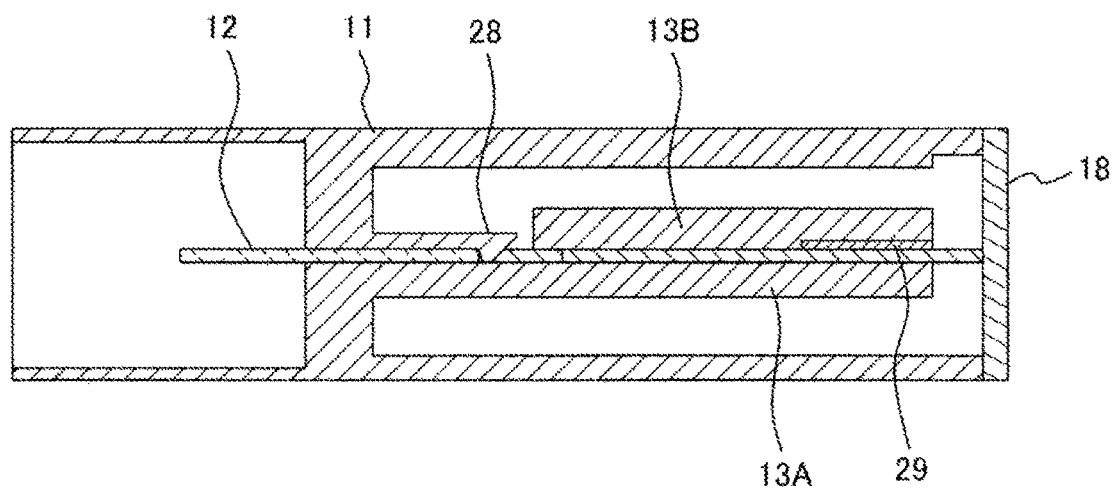
FIG. 11 is a longitudinal sectional view in a longitudinal direction of an electronic control device according to a fourth embodiment of the present invention.

In FIG. 11, the engaging part 28 is integrally formed with the board reception part 16 at the position corresponding to the step part 17 of the circuit board 12 illustrated in FIG. 2. Elasticity is applied to this engaging part 28 as with Example 1. On the other hand, a cutaway (not illustrated) is formed at each side surface part of the step part 17 on a lid cover 18 side and is configured to serve as a locking part.

Therefore, when the circuit board 12 is slid, guided, and inserted along a guide groove 13, the engaging part 28 is deflected by the step part 17 of the circuit board 12, and the circuit board 12 is inserted into a deep side. At this time, the step part 17 is in contact with and butted against the board reception part 16. At the same time, the engaging part 28 engages with a locking part including the cutaway and formed on each side surface part of the step part 17 of the circuit board 12.

It should be noted that a protrusion 29 is formed on a lid cover mounting part 15 side of a guide rail 13B and regulates or prevents movement of the circuit board 12 in a vertical direction. It should be noted that when the circuit board 12 is inserted, this protrusion 29 is in contact with the circuit board 12 over a long distance. Accordingly, the protrusion 29 is formed relatively longer than the protrusion 22 described in Example 1 or the like. Further, since the engaging part 28 and the step part 17 of the circuit board 12 are elastically in contact with each other, it contributes to prevention of the movement of the circuit board 12 in the vertical direction.

In this way, when the step part 17 formed at each side end part of the circuit board 12 and the board reception part 16 are butted against each other, movement of the circuit board 12 to the connector mounting part 14 side is prevented. Further, when the engaging part 28 formed at the board reception part 16 of the case body 11 is engaged with the locking part formed at each side surface part of the circuit board 12, movement of the circuit board 12 to the lid cover mounting part 15 side is prevented. Accordingly, a phenomenon of falling off of the circuit board 12 from the case body 11 can be solved. Moreover, the lid cover 18 and the lid cover mounting part 15 are welded to be sealed in this state by ultrasonic welding or the like.

In this way, when the circuit board 12 and the lid cover 18 are mounted to the case body 11, the circuit board 12 can be fixed inside the case body 11. Accordingly, the case body 11 and the circuit board 12 can be reliably fixed with a simple configuration. This configuration can solve a problem in that the circuit board 12 is fallen off, an electronic control device loses its function, and an internal combustion engine cannot be operated normally.

Example 5

Next, a fifth embodiment of the present invention will be described by using FIG. 12. This example describes a variation of Example 1 and describes a configuration in which an engaging part is locked to both guide rails 13A, 13B.

Figure 12:
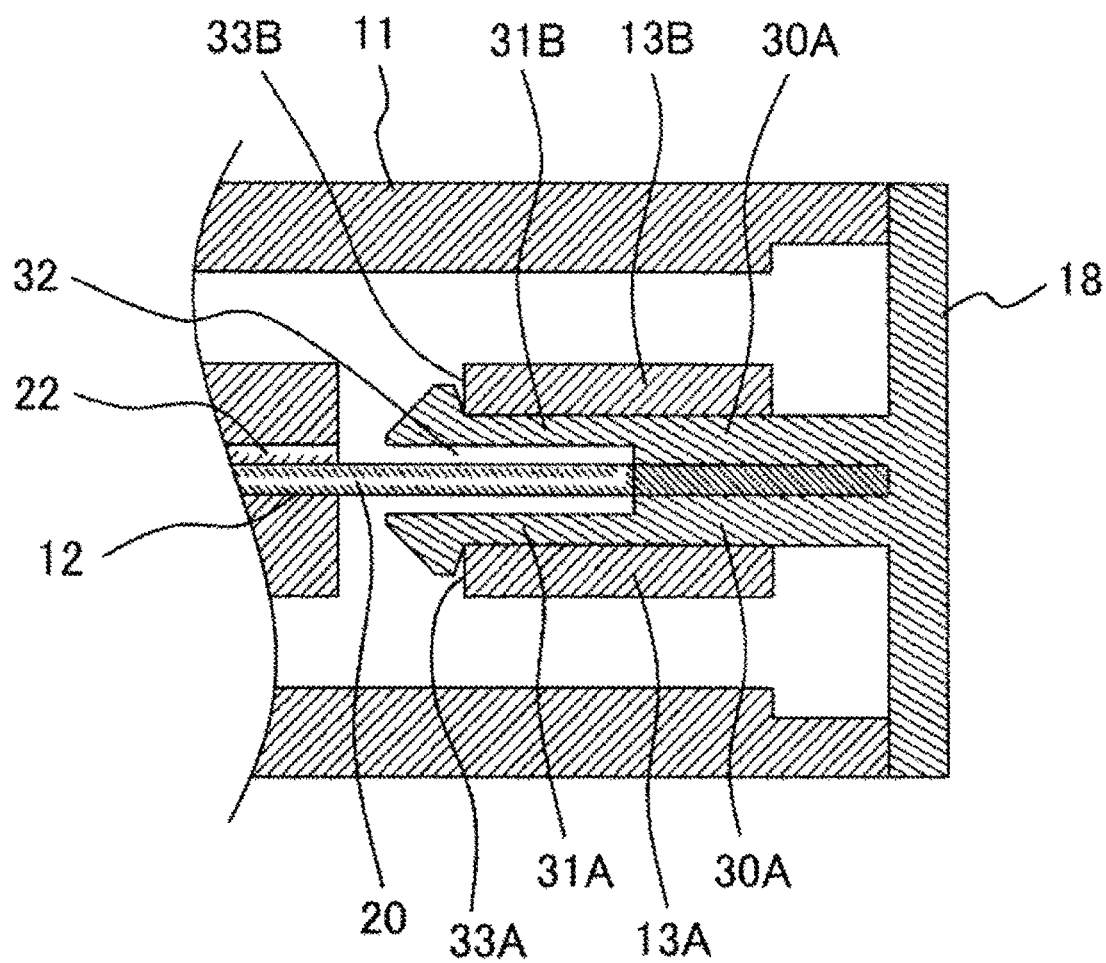
FIG. 12 is a longitudinal sectional view of a main part in a longitudinal direction of an electronic control device according to a fifth embodiment of the present invention.

In FIG. 12, an engaging part forming body 30 is integrally formed with each side end of a lid cover 18, and a circuit board 12 is inserted into this engaging part forming body 30 and integrated therewith with an adhesive or the like. Engaging parts 31A, 31B branched from the middle of the engaging part forming body 30 are formed on a tip side thereof, and a solid shaped part 30A is formed from this branched part to the lid cover 18 side. This solid shaped part 30A has a configuration press fitted between the guide rails 13A and 13B, and movement of the circuit board 12 in the vertical direction is regulated or prevented by the guide rails 13A, 13B via the solid shaped part 30A of the engaging part forming body 30.

In the above description, each side surface part of the circuit board 12 fixed to the lid cover 18 is inserted, slid, and guided into a guide groove 13 formed by the guide rails 13A and 13B inside the case body 11. At this time, pawl parts provided at tips of the engaging parts 31A, 31B are respectively deflected downward and upward by the guide rails 13A and 13B and are displaced to a cutaway part 32 of the circuit board 12 by this deflection. Accordingly, the circuit board 12 is guided in the guide groove 13 and advances toward a deep side of an inside of the case body 11, i.e., a connector mounting part 14 side. After passing through this process, a step part 17 formed at each side end part of the circuit board 12 and a board reception part 16 are butted against each other. Then, the engaging parts 31A, 31B of the lid cover 18 are respectively released from restriction by the guide rails 13A, 13B at these positions and returned to original positions by elasticity. The engaging parts 31A, 31B are respectively engaged with the locking parts 33A, 33B formed at the guide rail 13B.

In this way, when the step part 17 formed at each side end of the circuit board 12 and the board reception part 16 are butted against each other, movement of the circuit board 12 to the connector mounting part 14 side is prevented. Further, when the engaging parts 31A, 31B of the lid cover 18 are engaged with the locking parts 33A, 33B formed at the guide rails 13A, 13B, movement of the circuit board 12 to the lid cover mounting part 15 side is prevented. Accordingly, a phenomenon of falling off of the circuit board 12 from the case body 11 can be solved. Moreover, the lid cover 18 and the lid cover mounting part 15 are welded to be sealed in this state by ultrasonic welding or the like.

In this way, when the circuit board 12 and the lid cover 18 are mounted to the case body 11, the circuit board 12 can be fixed inside the case body 11. Accordingly, the case body 11 and the circuit board 12 can be reliably fixed with a simple configuration. This configuration can solve a problem in that the circuit board 12 is fallen off, an electronic control device loses its function, and an internal combustion engine cannot be operated normally.

Example 6

Figure 13:
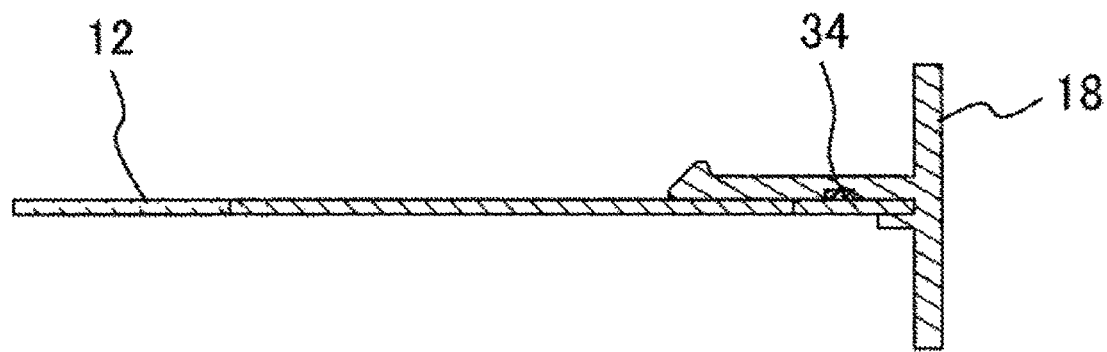
FIG. 13 is a longitudinal sectional view in a longitudinal direction when a circuit board and a lid cover according to a sixth embodiment of the present invention are combined.
Figure 14:
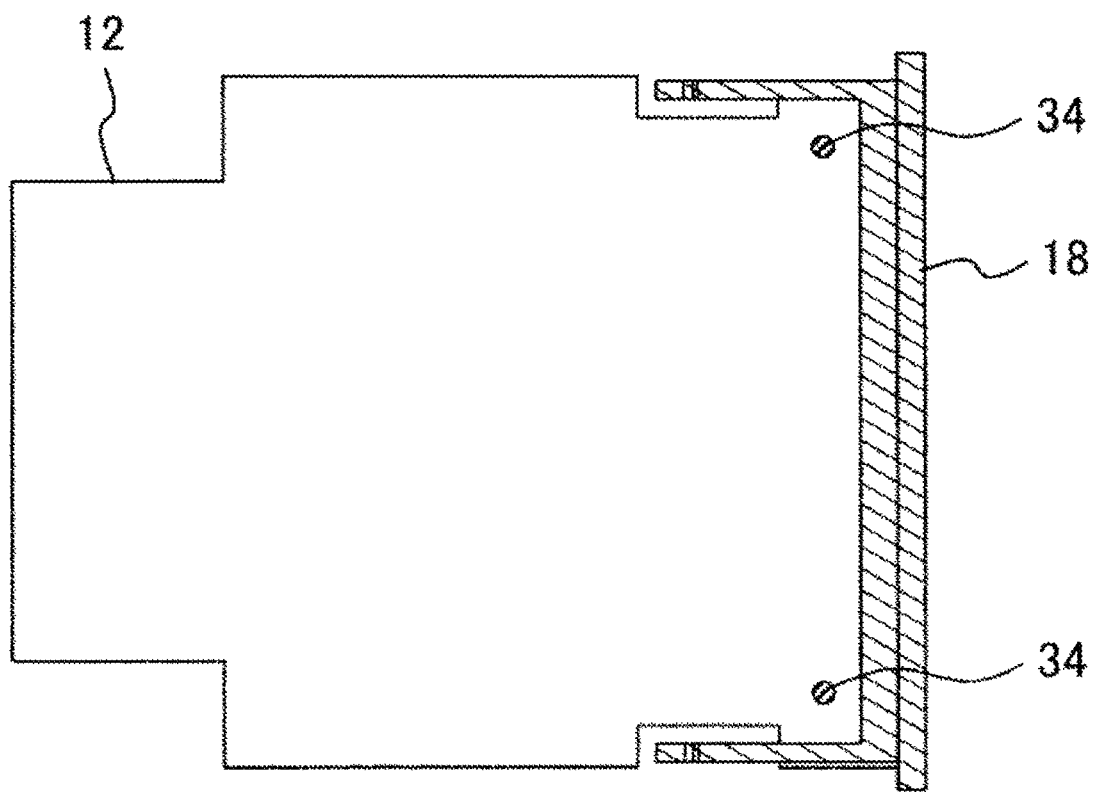
FIG. 14 is a top view when the circuit board and the lid cover illustrated in FIG. 13 are combined.

Next, a sixth embodiment of the present invention will be described by using FIGS. 13 and 14. FIG. 13 is a longitudinal sectional view in a longitudinal direction when a circuit board and a lid cover are combined. FIG. 14 is a top view in a longitudinal direction when the circuit board and the lid cover are combined.

This example is characterized in that a regulation part 34 for regulating movement of a circuit board 12 in a vertical direction is provided based on the configuration of Example 1. In Example 1, the protrusion 22 is used to regulate the movement of the circuit board 12 in the vertical direction. However, in the present example, the regulation part 34 for regulating the movement in the vertical direction is provided in a vicinity of a part of the circuit board 12 fixed to a lid cover 18. This regulation part 34 is inserted between a guide rail 13B and the circuit board 12 in a press fit form and is formed of a mechanical component, such as a solder, a screw, or a rivet. These components may be used singly or may be used in combination. Further, the regulation part 34 can be also obtained by utilizing a solder used for configuring a circuit of the circuit board 12, a screw for fixing an electronic component, or the like.

In this way, when the circuit board 12 is inserted into the guide groove 13, the regulation part 34 provided on the circuit board 12 is press fitted into the guide rail 13B. Accordingly, the regulation part 34 can regulate or prevent the movement of the circuit board 12 in the vertical direction.

Example 7

Next, a seventh embodiment of the present invention will be described by using FIG. 15. The present example describes an example in which the engaging part 19 formed at the lid cover 18 illustrated in FIG. 1 is separated and formed as a single body, and then is fixed to a circuit board 12.

Figure 15:
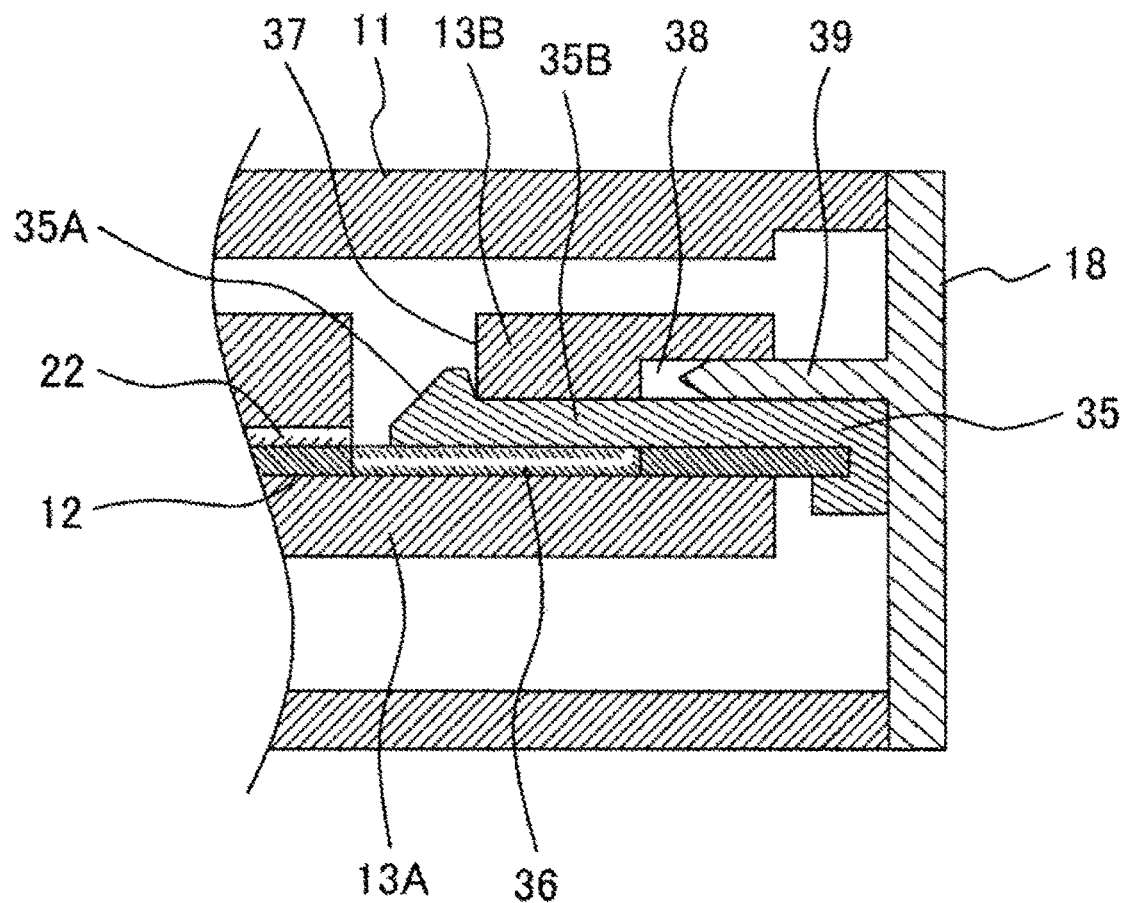
FIG. 15 is a longitudinal sectional view of a main part in a longitudinal direction of an electronic control device according to a seventh embodiment of the present invention.

In FIG. 15, an engaging part forming body 35 is fixed to both side surface parts of the circuit board 12 on a lid cover mounting part 15 side with an adhesive material or the like. Unlike Example 1, this engaging part forming body 35 is formed as the single engaging part forming body 35 by injection molding or the like. Further, since an engaging part 35A including a pawl part is provided as with Example 1, the engaging part 35A is elastically deformable in a state in which the engaging part forming body 35 is fixed to the circuit board 12.

In the above description, each side surface part of the circuit board 12, to which the engaging part forming body 35 is fixed, is inserted, slid, and guided into a guide groove 13 formed by guide rails 13A and 13B inside a case body 11. At this time, the pawl part provided at a tip of the engaging part 35A of the engaging part forming body 35 is deflected downward by the guide rail 13B and is displaced to a cutaway part 36 of the circuit board 12 by this deflection. Accordingly, the circuit board 12 is guided in the guide groove 13 and advances toward a deep side of an inside of the case body 11, i.e., a connector mounting part 14 side. After passing through this process, a step part 17 formed at each side end part of the circuit board 12 and a board reception part 16 are butted against each other. Then, the engaging part 35A of the engaging part forming body 35 fixed to the circuit board 12 at this position is released from restriction by the guide rail 13B and returned to an original position by elasticity. The engaging part 35A is engaged with a locking part 37 formed at the guide rail 13B.

In this state, a void 38 is formed between an upper surface part 35B of the engaging body formation part 35 and the guide rail 13B. Then, a filling part 39 to be inserted into this void 38 is formed inside the lid cover 18. Accordingly, when the lid cover 18 is mounted to the lid cover mounting part 15, the filling part 39 is inserted and put into the void 38, and the lid cover 18 and the lid cover mounting part 15 are subjected to ultrasonic welding.

Accordingly, the movement of the circuit board 12 in the vertical direction is regulated by action of the upper surface part of the engaging body formation part 35 and the filling part 39 provided between the circuit board 12 and the guide rail 13B. Particularly, when the filling part 39 is formed into a wedge shape, the movement of the circuit board 12 in the vertical direction can be regulated more strongly. In the present example, this wedge shape is employed for the filling part 39.

In this way, when the step part 17 formed at each side end of the circuit board 12 and the board reception part 16 are butted against each other, movement of the circuit board 12 to the connector mounting part 14 side is prevented. Further, when the engaging part 35A of the engaging part forming body 35 fixed to the circuit board 12 is engaged with the locking part 37 formed at the guide rail 13B, movement of the circuit board 12 to the lid cover mounting part 15 side is prevented. Accordingly, a phenomenon of falling off of the circuit board 12 from the case body 11 can be solved. Moreover, the lid cover 18 and the lid cover mounting part 15 are welded to be sealed in this state by the ultrasonic welding or the like.

Next, a variation of the present example illustrated in FIG. 16 will be described. A material formed by injection molding of a synthetic resin is used for the engaging part forming body 35 illustrated in FIG. 15. However, in the variation illustrated in FIG. 16, an engaging part forming body 40 formed of metal, e.g., stainless steel or spring steel, is used.

Figure 16:
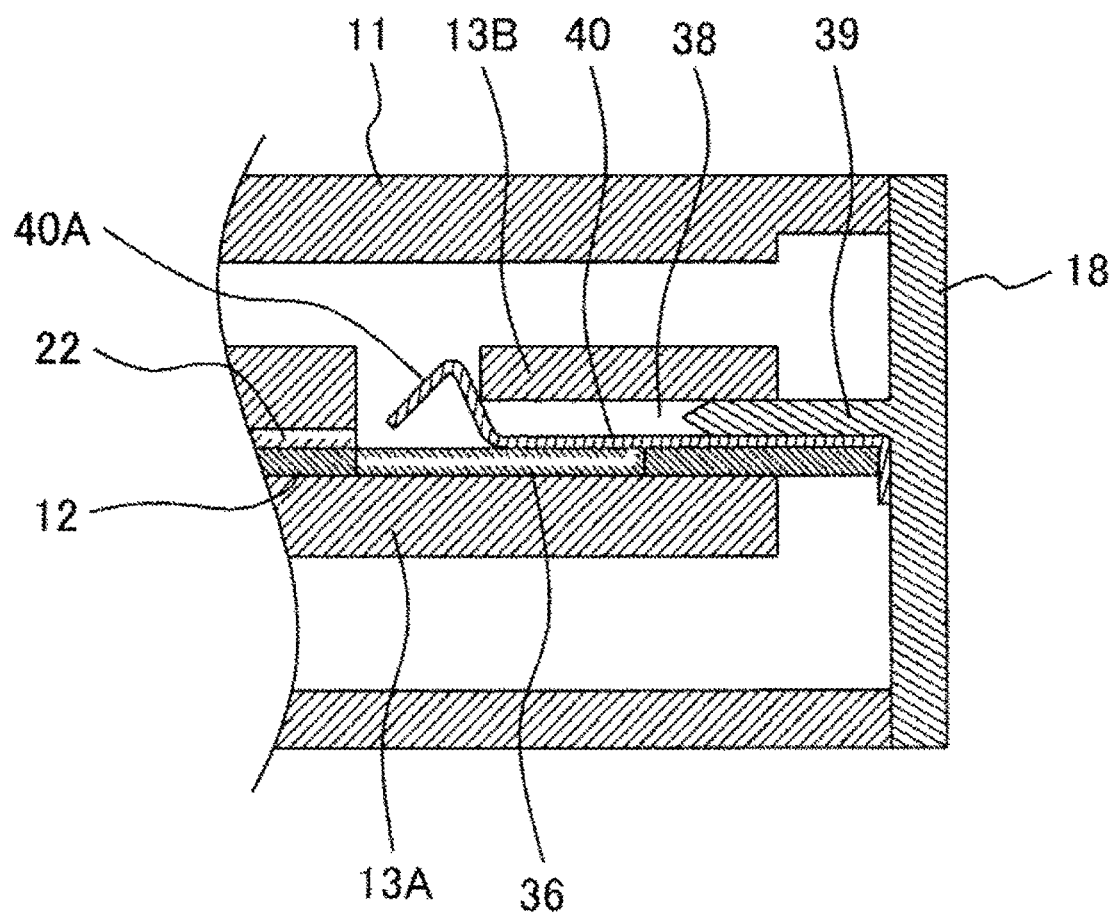
FIG. 16 is a longitudinal sectional view of a main part in a longitudinal direction of an electronic control device according to a variation of the seventh embodiment illustrated in FIG. 15.

As illustrated in FIG. 16, since an engaging part 40A with a pawl part is provided at this engaging part forming body 40 as well, the engaging part 40A is elastically deformable in a state in which the engaging part forming body 40 is fixed to the circuit board 12.

In the above description, each side surface part of the circuit board 12, to which the engaging part forming body 40 is fixed, is inserted, slid, and guided into a guide groove 13 formed by guide rails 13A and 13B inside a case body 11. At this time, the pawl part provided at a tip of the engaging part 40A of the engaging part forming body 40 is deflected downward by the guide rail 13B and is displaced to a cutaway part 36 of the circuit board 12 by this deflection. Accordingly, the circuit board 12 is guided in the guide groove 13 and advances toward a deep side of an inside of the case body 11, i.e., a connector mounting part 14 side. After passing through this process, a step part 17 formed at each side end part of the circuit board 12 and a board reception part 16 are butted against each other. Then, the engaging part 40A of the engaging part forming body 40 fixed to the circuit board 12 at this position is released from restriction by the guide rail 13B and returned to an original position by elasticity. The engaging part 40A is engaged with a locking part 37 formed at the guide rail 13B.

In this way, when the circuit board 12 and a lid cover 18 are mounted to the case body 11, the circuit board 12 can be fixed inside the case body 11. Accordingly, the case body 11 and the circuit board 12 can be reliably fixed with a simple configuration. This configuration can solve a problem in that the circuit board 12 is fallen off, an electronic control device loses its function, and an internal combustion engine cannot be operated normally.

Example 8

Figure 17:
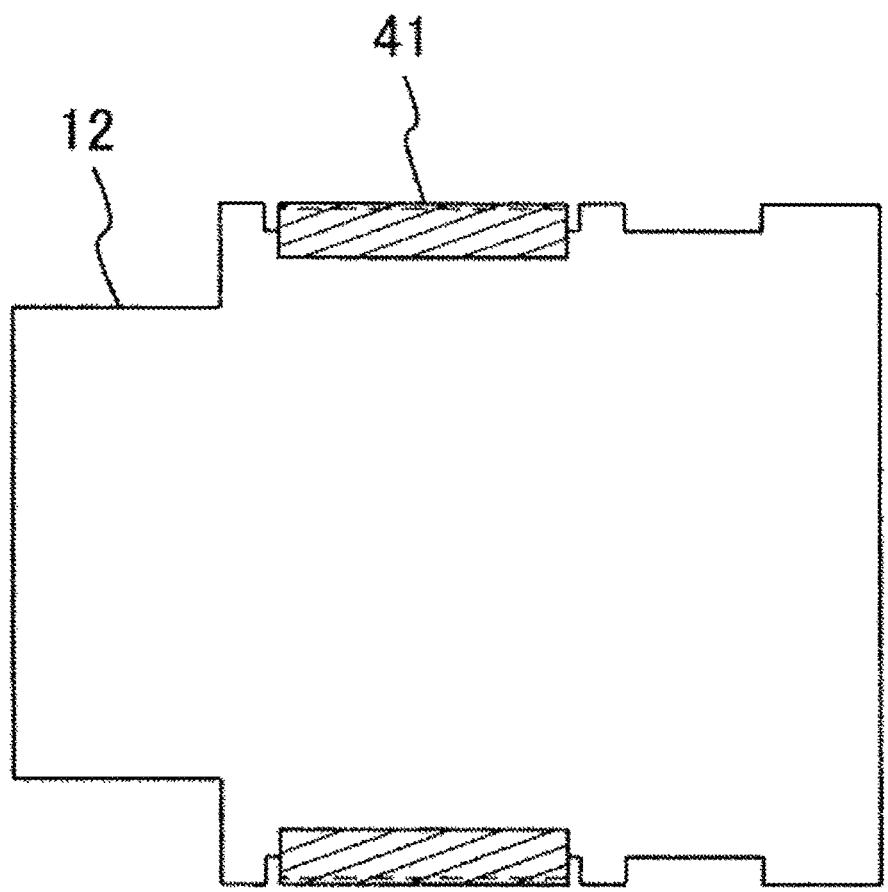
FIG. 17 is a top view in a longitudinal direction of a circuit board of an electronic control device according to an eighth embodiment of the present invention.
Figure 18:
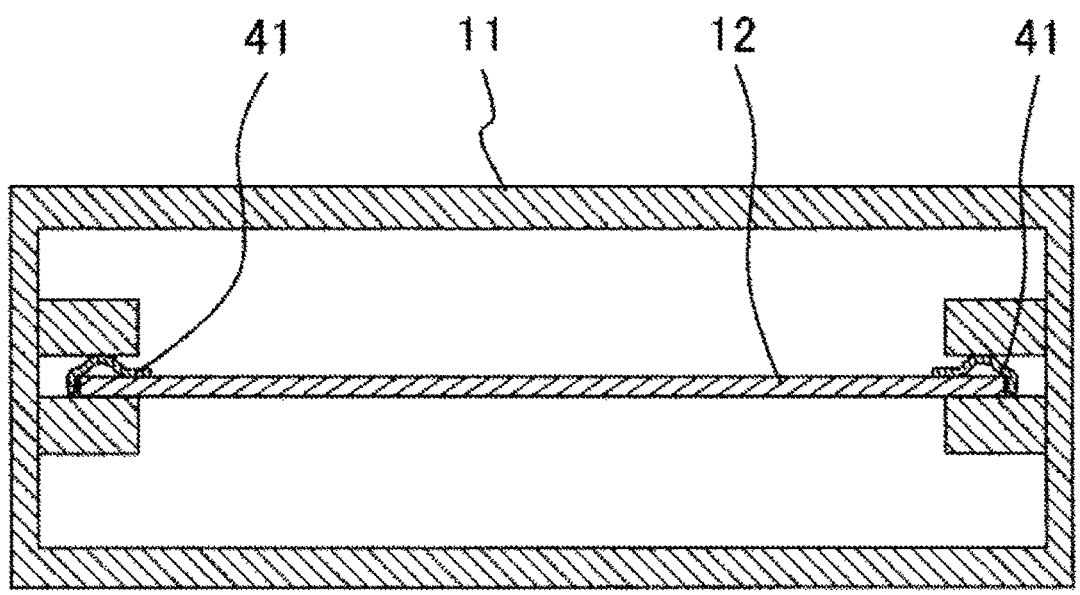
FIG. 18 is a longitudinal sectional view when the circuit board illustrated in FIG. 17 is housed in a case body.

Next, an eighth embodiment of the present invention will be described by using FIGS. 17 and 18. FIG. 17 is a top view when an elastic member for regulating movement in a vertical direction is mounted to each side surface part of a circuit board. FIG. 18 is a longitudinal sectional view when the circuit board is mounted to a case body.

In FIGS. 17, 18, an elastic member 41 formed of metal, e.g., spring steel or stainless steel, is mounted to each side surface part of a circuit board 12. This elastic member 41 is formed long so as to extend in a longitudinal direction of each side surface part of the circuit board 12. Then, when the circuit board 12 is inserted into a guide groove 13, the elastic member 41 is elastically interposed between the circuit board 12 and a guide rail 13B. Accordingly, movement of the circuit board 12 in the vertical direction can be suppressed.

Further, a cutaway 42 is formed at each side surface part of the circuit board 12, to which the elastic member 41 is mounted. Accordingly, when the elastic member 41 is crushed and deformed by the guide rail 13B, it is also possible that the elastic member 41 is deformed in a horizontal direction, brought in contact with a wall surface of a case body 11, and positioned in a transverse direction.

Needless to say, an engaging part and a locking part for preventing falling off of the circuit board 12 from the case body 11 are included, and any of the configurations in Example 1 to Example 7 is employed.

Example 9

Figure 19:
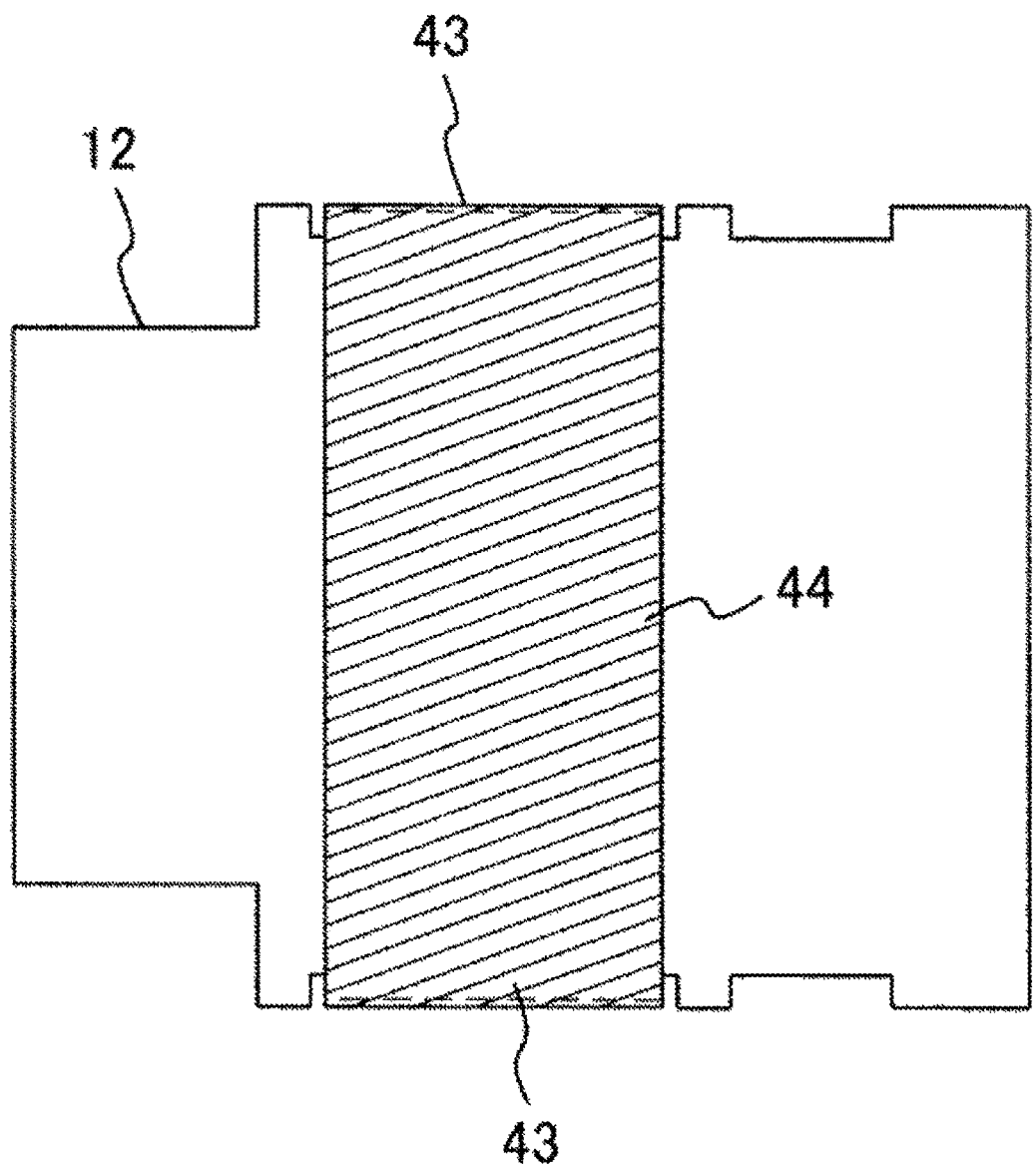
FIG. 19 is a top view in a longitudinal direction of a circuit board of an electronic control device according to a ninth embodiment of the present invention.
Figure 20:
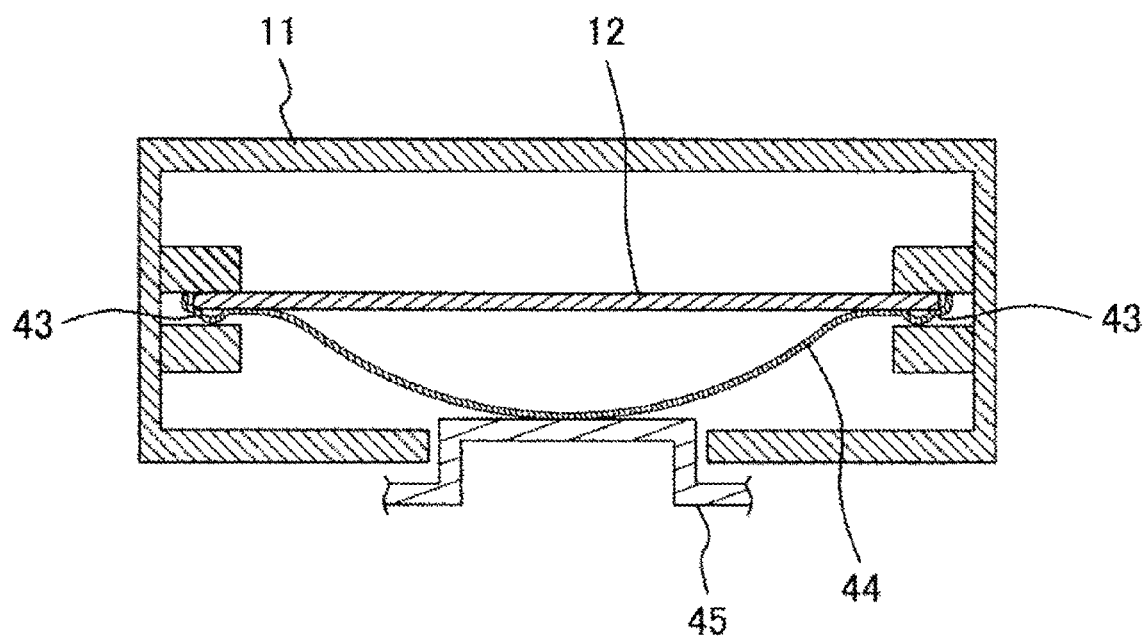
FIG. 20 is a longitudinal sectional view when the circuit board illustrated in FIG. 19 is housed in a case body.

Next, a ninth embodiment of the present invention will be described by using FIGS. 19 and 20. FIG. 19 is a top view when an elastic member for regulating movement in a vertical direction and dissipating heat is mounted to each side surface part of a circuit board. FIG. 20 is a longitudinal sectional view when the circuit board is mounted to a case body.

In FIGS. 19, 20, an elastic member 43 formed of metal, e.g., spring steel or stainless steel, is mounted to each side surface part of a circuit board 12. This elastic member 43 is formed long so as to extend in a longitudinal direction of each side surface part of the circuit board 12. Further, this elastic member 43 includes an arc part 44 extending in an arc shape on a rear surface of the circuit board 12, and the arc part 44 is integrally formed with the elastic member 43 at each side surface part of the circuit board 12.

Moreover, when the circuit board 12 is inserted into a guide groove 13, the elastic member 43 is elastically interposed between the circuit board 12 and a guide rail 13B. Accordingly, movement of the circuit board 12 in the vertical direction can be suppressed.

Further, the elastic member 43 includes the arc part 44 extending on the rear surface of the circuit board 12, and this arc part 44 is thermally connected to an external bracket 45 provided at a bottom surface part of a case body 11. The external bracket 45 is formed of a material having high thermal conductivity, such as aluminum or an aluminum alloy, and heat generated by the circuit board 12 is configured to flow into the external bracket 45 through the arc part 44.

Therefore, according to this configuration, since the heat generated by the circuit board 12 can be efficiently flowed into the external bracket 45, thermal durability of an electronic component mounted on the circuit board 12 can be improved.

Needless to say, in this example as well, an engaging part and a locking part for preventing falling off of the circuit board 12 from the case body 11 are included, and any of the configurations in Example 1 to Example 7 is employed.

According to the present invention, the elastically deformable engaging part and the engaged part complementarily engaging with this engaging part are provided on the circuit board or the case body. When the circuit board is slid and housed in the guide groove part formed inside the case body, the engaging part is deformed. When the circuit board reaches the predetermined position, the engaging part engages with the engaged part formed at the circuit board or the case body.

With this configuration, when the circuit board is slid in the guide groove part inside the case body, the engaging part is elastically deformed and the circuit board can be housed inside the case body. When the circuit board reaches the predetermined position, the engaging part can be engaged with the engaged part of the circuit board or the case body. Accordingly, the case body and the circuit board can be reliably fixed with a simple configuration. This configuration can solve a problem in that the circuit board is fallen off, an electronic control device loses its function, and an internal combustion engine cannot be operated normally.

REFERENCE SIGNS LIST 10 electronic control device
11 case body
12 circuit board
13 guide groove
13A, 13B guide rail
14 connector mounting part
15 lid cover mounting part
16 board reception part
17 step part
18 lid cover
19 engaging part
20 cutaway part
21 locking part
22 protrusion
23A, 23B step part
24A, 24B board reception part
25A, 25B protrusion
26 engaging part
27 locking part
28 gap
29 protrusion
30 engaging part forming body
31A, 31B engaging part
32 cutaway part
33A, 33B locking part
34 regulation part
35 engaging part forming body
36 cutaway part
37 locking part
38 void
39 filling part
40 engaging part forming body
41 elastic member
42 cutaway part
43 elastic member
44 arc part
45 external bracket

The invention claimed is:
1. An electronic control device comprising:
a circuit board mounted with an electronic component;
a case body in which a connector mounting part is formed at one end, a lid cover mounting part serving as an opening is formed at another end, and upper and lower guide rails forming a guide groove for inserting the circuit board are included on each internal side surface; and a lid cover for closing an open surface of the lid cover mounting part, the circuit board being held by the guide groove formed in an internal space of the case body, wherein
an elastically deformable engaging part is provided at the circuit board or the case body, an engaged part for complementarily engaging with the engaging part is provided at the circuit board or the case body,
the engaging part is deformed when the circuit board is slid and housed in the guide groove formed inside the case body, and
the engaging part is engaged with the engaged part formed at the circuit board or the case body when the circuit board reaches a predetermined position, wherein
the engaging part is integrally formed with each side of the lid cover,
the lid cover and the circuit board are integrally configured, and
when the circuit board is inserted into the guide groove and reaches the predetermined position, the engaging part engages with a locking part serving as the engaged part formed at the guide rail.

2. The electronic control device according to claim 1, wherein
a cutaway is formed at a part of the circuit board to which the engaging part is elastically displaced, and
displacement of the engaging part is allowed by the cutaway.

3. The electronic control device according to claim 1, wherein
a board reception part is formed in a vicinity of the connector mounting part,
a step part is formed on a side opposite to a part of the circuit board fixed to the lid cover, and
movement of the circuit board is regulated by butting the step part against the board reception part.

4. The electronic control device according to claim 1, wherein movement of a surface of the circuit board in a direction orthogonal to the circuit board is regulated by a protrusion formed inside the case body.

5. The electronic control device according to claim 4, wherein the protrusion is formed on the guide rail, and when the circuit board is slid in the guide groove, the protrusion is crushed and regulates the movement of the circuit board.

6. The electronic control device according to claim 3, wherein
at least two step parts are formed at the circuit board on the side opposite to the part of the circuit board fixed to the lid cover,
a length of the step part between both side surfaces on a tip side is set shorter,
the movement of the circuit board is regulated by butting one of the step parts against one of the two board reception parts corresponding to the step parts, and
the movement of the circuit board in the direction orthogonal to the circuit board is regulated by the protrusion formed inside the case body and corresponding to the step part.

7. The electronic control device according to claim 1, wherein
the engaging part is integrally formed with each side of the case body on the lid cover side,
the lid cover and the circuit board are integrally configured, and
when the circuit board is inserted into the guide groove and reaches the predetermined position, the engaging part engages with a locking part serving as the engaged part formed at the circuit board.

8. The electronic control device according to claim 1, wherein
the engaging part is integrally formed with each side of the case body on the connector mounting part side, the lid cover and the circuit board are integrally configured, and
when the circuit board is inserted into the guide groove and reaches the predetermined position, the engaging part engages with a locking part serving as the engaged part and formed on the circuit board.

9. The electronic control device according to claim 1, wherein
an engaging part forming body integrally formed with the pair of engaging parts is formed on both sides of the lid cover,
the lid cover and the circuit board are integrally configured, and
when the circuit board is inserted into the guide groove and reaches the predetermined position, the pair of engaging parts engages with a pair of locking parts serving as the engaged part and formed at the upper and lower guide rails.

10. The electronic control device according to claim 9, wherein the engaging part forming body fixes the circuit board and includes a solid shaped part in contact with the upper and lower guide rails.

11. The electronic control device according to claim 1, wherein a regulation part protruding toward the guide rail side is provided on the surface of the circuit board, and the regulation part is provided between the guide rail and the circuit board and regulates movement of the circuit board in the direction orthogonal to the circuit board.

12. The electronic control device according to claim 1, wherein an engaging part forming body formed with the engaging part and separated from the lid cover is fixed to the circuit board on the lid cover side, and when the circuit board is inserted into the guide groove and reaches the predetermined position, the engaging part engages with a locking part serving as the engaged part formed at the guide rail.

13. The electronic control device according to claim 12, wherein
a void is formed between the engaging part forming body and the guide rail, and
when the lid cover is mounted to the lid cover mounting part, a filling part formed at the lid cover is put into the void, and movement of the circuit board is regulated by the guide rail.

14. The electronic control device according to claim 1, wherein
an elastic member formed of metal is provided on each side surface part of the circuit board along a longitudinal direction, and
the elastic member is compressed and interposed between the guide rail and the circuit board.

15. The electronic control device according to claim 14, wherein
the elastic member integrally has an arc part extending on a rear surface side of the circuit board, and
the arc part is thermally in contact with a material having good thermal conductivity provided on the case body.

* * * * *